United States Patent
Kobrin et al.

(10) Patent No.: US 8,236,379 B2
(45) Date of Patent: Aug. 7, 2012

(54) ARTICLES WITH SUPER-HYDROPHOBIC AND-OR SUPER-HYDROPHILIC SURFACES AND METHOD OF FORMATION

(75) Inventors: Boris Kobrin, Walnut Creek, CA (US); Jeffrey D. Chin, Foster City, CA (US); Benigno A. Janeiro, Pleasanton, CA (US); Romuald Nowak, Cupertino, CA (US)

(73) Assignee: Applied Microstructures, Inc., San Jose, CA (US)

( * ) Notice: Subject to any disclaimer, the term of this patent is extended or adjusted under 35 U.S.C. 154(b) by 1318 days.

(21) Appl. No.: 11/904,522

(22) Filed: Sep. 26, 2007
(Under 37 CFR 1.47)

(65) Prior Publication Data
US 2008/0241512 A1    Oct. 2, 2008

Related U.S. Application Data

(60) Provisional application No. 60/921,618, filed on Apr. 2, 2007, provisional application No. 60/926,205, filed on Apr. 24, 2007.

(51) Int. Cl.
| | |
|---|---|
| *B05D 1/12* | (2006.01) |
| *C23C 16/00* | (2006.01) |
| *C23C 16/30* | (2006.01) |
| *C23C 16/40* | (2006.01) |

(52) U.S. Cl. ............ 427/248.1; 427/180; 427/255.17; 427/255.18; 427/255.28; 427/255.37

(58) Field of Classification Search ........... 427/248.1, 427/255.17, 255.18, 255.28, 255.37, 180
See application file for complete search history.

(56) References Cited

U.S. PATENT DOCUMENTS

| | | | |
|---|---|---|---|
| 3,924,032 A | 12/1975 | Hertl | |
| 4,780,334 A | 10/1988 | Ackerman | |
| 4,940,854 A | 7/1990 | Debe | |
| 4,976,703 A | 12/1990 | Franetzki et al. | |
| 4,992,306 A | 2/1991 | Hochberg et al. | |
| 5,244,654 A | 9/1993 | Narayanan | |
| 5,314,724 A | 5/1994 | Tsukune et al. | |
| 5,352,485 A | 10/1994 | DeGuire et al. | |
| 5,372,851 A | 12/1994 | Ogawa et al. | |
| 5,480,488 A | 1/1996 | Bittner et al. | |
| 5,527,744 A | 6/1996 | Mignardi et al. | |
| 5,741,551 A | 4/1998 | Guire et al. | |
| 5,804,259 A | 9/1998 | Robles | |
| 5,879,459 A | 3/1999 | Gadgil et al. | |
| 5,902,636 A * | 5/1999 | Grabbe et al. | ............ 427/221 |
| 5,932,299 A | 8/1999 | Katoot | |

(Continued)

OTHER PUBLICATIONS

Herrmann "Hydrophobic coatings using atomic layer deposition and non chlorinated precursors" 2004 Nanoscale Sci. and design, p. 653-656.*

(Continued)

*Primary Examiner* — Timothy Meeks
*Assistant Examiner* — Mandy Louie
(74) *Attorney, Agent, or Firm* — Martine Penilla Group, LLP

(57) ABSTRACT

The present invention is related to a chemical vapor deposition method of depositing layers of materials to provide super-hydrophilic surface properties, or super-hydrophobic surface properties, or combinations of such properties at various locations on a given surface. The invention also relates to electronic applications which make use of super-hydrophobic surface properties, and to biological applications which make use of super-hydrophilic surface properties.

13 Claims, 6 Drawing Sheets

No.3 Rms = 88.83 nm 0.00 μm    2.58 μm    5.17 μm 577.28 nm 0.00 nm

U.S. PATENT DOCUMENTS

| | | | |
|---|---|---|---|
| 5,952,778 A | 9/1999 | Haskal et al. ............... | 313/504 |
| 5,962,079 A | 10/1999 | Koberstein et al. | |
| 5,966,499 A | 10/1999 | Hinkle et al. | |
| 5,989,345 A | 11/1999 | Hatano | |
| 6,068,884 A | 5/2000 | Rose et al. | |
| 6,099,562 A | 8/2000 | Ding et al. | |
| 6,165,566 A | 12/2000 | Tropsha | |
| 6,225,237 B1 | 5/2001 | Vaartstra | |
| 6,358,863 B1 | 3/2002 | Desu et al. | |
| 6,475,910 B1 | 11/2002 | Sneh ............... | 438/685 |
| 6,503,330 B1 | 1/2003 | Sneh et al. | |
| 6,743,516 B2 | 6/2004 | Murphy et al. | |
| 6,743,736 B2 | 6/2004 | Mardian et al. | |
| 6,905,549 B2 | 6/2005 | Okuda et al. | |
| 6,926,572 B2 | 8/2005 | Park et al. ............... | 445/24 |
| 6,963,125 B2 | 11/2005 | Featherby et al. ............ | 257/680 |
| 7,208,195 B2 | 4/2007 | Kalynushkin et al. | |
| 2002/0164420 A1 | 11/2002 | Derderian et al. | |
| 2003/0180458 A1 | 9/2003 | Sneh | |
| 2004/0067339 A1* | 4/2004 | Gandon et al. ............... | 428/141 |
| 2004/0182316 A1 | 9/2004 | Watanabe | |
| 2004/0194691 A1 | 10/2004 | George et al. ............... | 117/84 |
| 2004/0261703 A1 | 12/2004 | Kobrin et al. ............... | 118/715 |
| 2005/0012975 A1 | 1/2005 | George et al. ............... | 359/223 |
| 2005/0079708 A1 | 4/2005 | Yamasaki et al. | |
| 2005/0081787 A1 | 4/2005 | Im et al. | |
| 2005/0109277 A1 | 5/2005 | Kobrin et al. | |
| 2005/0113936 A1* | 5/2005 | Brustad et al. ............ | 623/23.71 |
| 2005/0118428 A1 | 6/2005 | Bicker et al. | |
| 2005/0129927 A1* | 6/2005 | Minami et al. ............... | 428/323 |
| 2005/0181195 A1 | 8/2005 | Dubrow ............... | 428/297.4 |
| 2005/0219788 A1 | 10/2005 | Chow et al. ............... | 361/305 |
| 2005/0271900 A1* | 12/2005 | Kobrin et al. ............... | 428/701 |
| 2006/0029808 A1* | 2/2006 | Zhai et al. ............... | 428/412 |
| 2006/0078724 A1 | 4/2006 | Bhushan et al. ............ | 428/323 |
| 2006/0110542 A1* | 5/2006 | Dietz et al. ............... | 427/384 |

OTHER PUBLICATIONS

Meng "Wettability conversion on ZnO nanowire arrays surface modified by oxygen plasma treatment and annealing" Aug. 30, 2005, Chem Phys Let. 413 p. 450-453.*

International Search Report of corresponding PCT Application Serial No. PCT/US08/04158.

Ehrlich, D.J., et al., "Fast Room-temperature Growth of $SiO_2$ Films by Molecular-Layer Dosing," *Appl. Phys. Lett.*, (Jun. 1991), vol. 58, No. 23, pp. 2675-2677.

Bell et al., "Using Poly(ethylene glycol) Silane to Prevent Protein Adsorption in Microfabricated Silicon Channels," Mar. 26, 1998, SPIE vol. 3258, pp. 134-138.

Zhang et al., "Hemocompatible Polyethylene Glycol Films on Silicon," Biomedical Microdevices Center, U.C. Berkeley, (Sep. 1998), vol. 1, No. 1, pp. 81-89.

J.W. Klaus, et al., "$SiO_2$ Chemical Vapor Deposition at Room Temperature Using $SiCl_4$ and $H_2O$ with an $NH_3$ Catalyst," Journal of the Electrochem. Soc., Mar. 24, 2000, vol. 147, No. 7, pp. 2658-2644.

McDonald et al., "Fabrication of Microfluidic Systems in Poly(dimethylsiloxane)," *Electrophoresis*, 2000, vol. 21, pp. 27-40.

Donzel et al., "Hydrophilic Poly(dimethylsiloxane) Stamps for Microcontact Printing," Advanced Materials, Aug. 2001, vol. 13, Issue 15, pp. 1164-1167.

K. Efimenko et al., "Surface Modification of Sylgard-184 Poly(dimethyl siloxane) Networks by Ultraviolet and Ultraviolet/Ozone Treatment," Journal of Colloid and Interface Science, vol. 254, Mar. 5, 2002, pp. 306-315.

Popat et al., "Vapor Deposited Poly(ethylene glycol) Films for Surface Modification of Microfluidic Systems," LabAutomation 2002, Palm Springs, CA, Jun. 1, 2002, vol. 7, Issue 3, pp. 65-67.

Choi et al., "Comparison of the Removal Efficiency for Organic Contaminants on Silicon Wafers Stored in Plastic Boxes Between $UV/O_3$ and ECR Oxygen Plasma Cleaning Methods," Thin Solid Films, Inchon, S. Korea, Jul. 1, 2003, vol. 435, pp. 227-231.

Berdichevsky et al., UV/Ozone Modification of Poly(dimethylsilocane) Microfluidic Channels. Sensors and Actuators, vol. 97, Feb. 1, 2004, pp. 402-408.

Perez-Mariano et al., "Multilayer Coatings by Chemical Vapor Deposition in a Fluidized Bed Reactor at Atmospheric Pressure (AP/FBR-CVD): TiN/TaN and TiN/W," ScienceDirect, Surface and Coatings Technology, 2006, vol. 201, Issue 6, pp. 2174-2180.

L. Zhai et al., "Stable Superhydrophobic Coatings from Polyelectrolyte Multilayers", Nano Letters, vol. 4, No. 7, pp. 1349-1353 (2004).

N. Zhao et al., "Fabrication of Biomimetic Superhydrophobic Coating with a Micro-Nano-Binary Structure", Macromolecular Rapid Communications, vol. 26, pp. 1075-1080 (2005).

* cited by examiner

ARTICLES WITH SUPER-HYDROPHOBIC AND-OR SUPER-HYDROPHILIC SURFACES AND METHOD OF FORMATION

The present application claims priority under two provisional applications, Application Ser. No. 60/921,618, filed Apr. 2, 2007, and titled: "CVD Method Of Surface Treatment To Provide Super-Hydrophobic and Super-Hydrophilic Properties", and Application Ser. No. 60/926,205, filed Apr. 24, 2007, and titled: "Method Of Forming Super-Hydrophobic And Super-Hydrophilic Films And Articles Having The Films". Each of these provisional applications is incorporated by reference herein in its entirety. In addition, the present application is related to a series of patent applications pertaining to the application of thin film coatings on various substrates, particularly including the following applications, each of which is hereby incorporated by reference in its entirety: U.S. application Ser. No. 10/759,857, filed Jan. 17, 2004, and titled: Apparatus And Method For Controlled Application Of Reactive Vapors To Produce Thin Films and Coatings; U.S. application Ser. No. 11/112,664, filed Apr. 21, 2005, and titled: Controlled Deposition Of Multilayered Coatings Adhered By An Oxide Layer; U.S. application Ser. No. 11/295,129, filed Dec. 5, 2005, and titled: Controlled Vapor Deposition Of Biocompatible Coatings Over Surface Treated Substrates; U.S. application Ser. No. 10/912,656, filed Aug. 4, 2004, and titled: Vapor Deposited Functional Organic Coatings; U.S. application Ser. No. 11/123,487, filed May 5, 2005, and titled: Controlled Vapor Deposition Of Biocompatible Coatings For Medical Devices; U.S. patent application Ser. No. 11/447,186, filed Jun. 5, 2006, and titled: Protective Thin Films For Use During Fabrication Of Semiconductors, MEMS, and Microstructures; and U.S. Patent Application Ser. No. 60/930,290, filed May 14, 2007, and titled: "Durable Multi-Layer Coatings And Coated Articles".

BACKGROUND OF THE INVENTION

1. Field of the Invention

The present invention is related to a method of creating super hydrophilic surfaces, super hydrophobic surfaces, and combinations thereof. In addition, the invention is related to creation of such surfaces on consumer products such as, for example, electronic devices, optical devices, and others, to enhance performance of the product.

2. Brief Description of the Background Art

This section describes background subject matter related to the invention, with the purpose of aiding one skilled in the art to better understand the disclosure of the invention. There is no intention, either express or implied, that the background art discussed in this section legally constitutes prior art.

Super-hydrophobic and super-hydrophilic materials are typically characterized by reference to a water contact angle with the surface of the material. A water contact angle which is greater than about 120 degrees is typically considered to be indicative of a super hydrophobic material. Some of the more advanced super hydrophobic materials exhibit a water contact angle in the range of about 150 degrees. A super-hydrophilic material is typically characterized by a water contact angle of 0 (zero) degrees, which results in an instantaneous wetting of the surface of such a material.

Super hydrophobic surface properties are very desirable in a number of consumer product applications, as the surface is protected from wetting and contamination. For example, an electronic device which might otherwise be shorted out upon becoming wet may be treated to provide a protective hydrophobic surface which keeps the device clean and dry.

Super hydrophobic surfaces may be created by processing of an existing surface. Typical methods of converting material surfaces to become super hydrophobic include, for example: 1) Etching the existing surface to create specific nano-patterns (patterns which are in the nanometer size range), and subsequently coating the surface with a hydrophobic coating. 2) Roughening the substrate surface using techniques known in the art, and functionalizing the resulting surface by applying a hydrophobic coating. 3) Growing a rough (or porous) film from solutions containing nano-particles or polymers in a way which creates a rough and hydrophobic surface on the material.

Generally hydrophobic surfaces have been created in recent years by deposition of common fluorocarbon coatings over a surface. Such fluorocarbon coatings may be created by application of self-assembled perfluorocarbon monolayers (fluorine-containing SAMs), for example. However such surfaces tend to have a water contact angle which is less than about 120 degrees. To obtain a higher water contact angle, it appears to be necessary to texturize the surface prior to application of such a fluorocarbon coating. Although a substrate modified to contain a nano-pattern alone can provide a super-hydrophobic behavior (if the material is hydrophobic to begin with) with respect to a given liquid, a combination of both the nano-patterned surface with a hydrophobic surface finish is helpful in providing and maintaining long term super-hydrophobic behavior of a surface.

Most known man made materials are either hydrophilic or hydrophobic, with their respective surface wetting properties varying within a wide range. Roughening and texturing of a material surface for the purpose of creating a super-hydrophobic or a super-hydrophilic surface is typically done using one of the following methods, each of which has respective advantages and disadvantages.

1. Micro-nano-patterning by material removal: a) The surface may be chemically etched. For example, $XeF_2$ may be used to pattern etch silicon, or HF may be used to pattern etch a silicon oxide. b) The surface may be patterned by plasma etching, such as that used in photo and nano-imprint lithography. c) The surface may be random patterned (roughened) using ion beams, biased plasmas, or laser ablation. d) The surface may be patterned by directly writing a pattern using an electron beam or a laser, or may be patterned through a mask using plasma etching.

2. Surface Texturing: a) The surface may be thermally embossed or imprinted when the material is a thermoplastic. b) The surface may be laser treated when the material is polymeric. c) Inorganic material surfaces may be high temperature annealed, such as in the high temperature annealing of polysilicon.

3. Material deposition or treatment: a) A liquid coating of colloidal nano-particles or a gel may be spin-coated over the surface of a substrate material. b) A porous surface layer may be created over a material by casting of a polymeric precursor in combination with a non-miscible substance, such as with moisture, for example. c) A metal surface may be treated using micro-arc oxidation.

The effectiveness of coating of a textured or roughened surface to produce a super-hydrophobic behavior is typically limited by adhesion of the super-hydrophobic coating material to the substrate material surface. Therefore, many materials (e.g. plastics, polymers, and certain noble metals) may require the use of adhesion layers such as silica, alumina, or other adhesion promoters which are applied over the substrate material surface prior to application of a super-hydrophobic coating material over a textured or roughened surface. Physical vapor deposition (PVD), chemical vapor deposition (CVD), atomic layer deposition (ALD) and other deposition techniques may be used to apply an adhesion-promoting layer. The surface of an adhesion-promoting layer applied in such a manner is typically smooth and replicates the underlying material surface topography.

Bharat Bhushan et al., in U.S. application Ser. No. 11/094,867, filed Mar. 31, 2005, and titled "Hydrophobic Surface With Geometric Roughness", describes the texturing of a surface to form asperities structures, with subsequent coating or functionalizing of the geometrically patterned surface to produce hydrophobic properties. The Abstract teaches: "A hydrophobic surface comprising a substrate and a roughened surface structure oriented on the substrate material is provided. The substrate comprises a surface, which is at least partially hydrophobic with a contact angle to liquid of 90 degrees or greater. The roughened surface structure comprises a plurality of asperities arranged in a geometric pattern according to a roughness factor, wherein the roughness factor is characterized by a packing parameter p that equals the fraction of the surface area of the substrate covered by the asperities. The p parameter has a value from between about 0.5 and 1." An exemplary drawing of such a surface shows hemispherically topped pyramidal asperities.

N. Zhau et al., in an article entitled "Fabrication of Biomimetic Superhydrophobic Coating with a Micro-nano-binary Structure", Macromolecular Rapid Communication, 205, 26, 1075-1080, describe fabrication of a super-hydrophobic coating by casting a polymer solution of bisphenol A polycarbonate (PC) in the presence of moisture. The method comprises a controlled solvent evaporation from the casting solution in the presence of moisture. A porous polymer surface is formed with a micro-nano-binary structure which is said to be similar to that of a lotus leaf.

The authors teach that they clearly showed from the experimental results that humid air was a crucial element for the formation of the hierarchical structure. In addition, the authors propose that casting a polymer solution in the presence of moisture has frequently been used in the fabrication of porous polymer membranes. The influence of moisture on the morphology of the resulting membrane is said to largely depend on the miscibility of the solvent with water. With a water-immiscible solvent, water micro-droplets will condense on the solution surface due to evaporation cooling and then act as a template. After solidification, a honeycomb-patterned porous film is said to be formed. The paper provides illustrations of SEM images of coatings cast at room temperature at different relative humidity, ranging from 20% up to 75%.

In an article by L. Zhai, et al., titled "Stable Superhydrophobic Coating from Polyelectrolyte Multilayers", Nanoletter, 2004, V4, 1349-1353, the authors describe the formation of super-hydrophobic surfaces by coating a honeycomb-like surface covered with silica nano-particles. The coating applied over the surface is formed by a chemical vapor deposition (CVD) of tridecafluoro-1,1,2,2-tetrahydrooctyl)-1-trichlorosilane (a semifluorinated silane). Superhydrophobicity is said to have been achieved by coating this highly textured multilayer surface with a semifluorinated silane. The super hydrophobic surface is said to maintain its super hydrophobic character even after extended immersion in water.

In one embodiment, the authors describe a layer-by layer process of forming multilayers which fabricate conformal thin films. The layer-by-layer film application is said to be useful for any surface amenable to a water-based adsorption process used to construct the polyelectrolyte multilayers. In particular, the authors claim to have discovered that, by using an appropriate combination of acidic treatments PAH/PAA 8.5/3.5, films can be induced to form pores on the order of 10 microns and a honeycomb-like structure on a surface. PAH is poly(allylamine hudrochloride), and PAA is poly (acrylic acid). The surface roughness of such films may be 400 nm, for example. A dense film is created, followed by staged low pH treatments, followed by crosslinking at 180° C. for 2 hours. Subsequently, an $SiO_2$ nanoparticle deposition is carried out, in which 50 nm $SiO_2$ nanoparticles are deposited by alternating dipping of the substrates into an aqueous suspension of negatively charged nanoparticles and an aqueous PAH solution, followed by a final dipping of the substrate into the nanoparticle suspension. The surface is then modified by the CVD coating deposition described above. Finally, the coated substrate is treated using a 2 hour baking at 180° C. to remove unreacted semifluorinated silane.

With respect to the production of super hydrophobic surfaces on useful articles, there are nearly unlimited potential applications. One area of particularly beneficial use is to reduce the contamination and corrosion of electronic boards of the kind used in common electronic products. Many failures of electronic consumer products are due to corrosion and electric shorts caused by accidental wetting or atmospheric moisture condensation on components and wiring leads of electronic boards. In addition, spill accidents are statistically responsible for about 20% of all portable electronics replacements. Marine electronics products and products exposed to wet or humid conditions are particularly vulnerable to such failures. Electronic board reliability in humid and wet environment is also critical to performance of consumer electronics portable devices such as GPS, cell phones, PDA assistants, computers, digital cameras, video games and others.

Due to improvements in materials and electronic device packaging technologies, individual device (chip) reliability has reached new levels, above 99.95%. However, the performance of electronic boards, board interconnects and mounting remain as critical bottlenecks for product reliability. Surfaces of most electronic board materials and components are hydrophilic, which promotes moisture condensation and wetting. Therefore, device performance and reliability can be compromised when electronic boards are exposed to liquids or excessive moisture during everyday use. Environmental contaminants which form ionic solutions in a wet environment can result in leakage or shorts between the device leads. Corrosion over time can further damage electrical connections and render devices non-operational. Encapsulation of the entire electronic board with a moisture protective coating can prevent such damage. However, due to a relatively high cost of such protective coatings, and other disadvantages such as, for example, poor heat dissipation, only specialty and military use electronics use board level protection in the form of a moisture-resistant coating. Parylene, silicone, epoxy, urethane, and other similar coatings have been used in the past, each of them having a number of disadvantages and limitations.

Metal oxides, and in particular aluminum oxide (alumina) and titanium oxide (titania) coatings are known to provide moisture protection and are of particular interest as replacements for the kinds of coatings such as the urethane, epoxy, silicone and parylene coatings mentioned above. The metal oxide coatings can be deposited by means such as physical vapor deposition (PVD) or atomic layer deposition (ALD) methods. However, the coatings generated are not super hydrophobic in nature.

Featherby et al., in U.S. Pat. No. 6,963,125, issued Nov. 8, 2005 and entitled "Electronic Device Packaging", describe an encapsulation method for electronic packaging. The encapsulation is provided by a coating consisting of two layers: 1)

an inorganic layer preventing moisture intake, and 2) an outside organic layer protecting the inorganic layer. Both layers are said to be integrated with an electronic device plastic package. Several inorganic materials, such a silicon nitride, aluminum nitride, titanium nitride and other oxides are suggested for formation of the inorganic layer. These layers may be deposited by PVD, CVD, or ALD, to provide a first continuous layer over a substrate. Subsequently, an organic layer, said to be preferably Parylene C (Col. 10) is applied directly over the inorganic layer. The organic layer has the primary function of protecting the brittle inorganic coating during manufacturing steps such as injection molding.

The use of a dual layer of an inorganic alumina film in combination with an overlying alkylaminosilane hydrophobic coating attached to alumina hydroxyl groups was proposed for wear and stiction protection in micro-electro-mechanical (MEMS) devices in U.S. patent application Ser. No. 10/910,525 filed by George et al. on Aug. 2, 2004. The application, is entitled "$Al_2O_3$ Atomic Layer Deposition to Enhance the Deposition of Hydrophobic or Hydrophilic Coatings on Micro-electromechanical Devices". In addition, George et al. proposed the use of ALD alumina films as moisture and gas barriers on polymer substrate surfaces in U.S. application Ser. No. 10/482,627, filed on Jul. 16, 2002, and entitled "Method of Depositing an Inorganic Film on an Organic Polymer".

With the development of electroluminescent devices, flat panel displays, organic light emitting diodes (OLEDS), and flexible electronics, there is even a stronger need to protect such devices from performance degradation due to oxidation and moisture corrosion. PVD and ALD alumina films have been tried extensively for such application. However, the single or dual layer protective coatings were found to be inadequate in many cases. Subsequently, various multilayer film laminates have been explored and are currently being considered as a hermetic glass package replacement for use in devices requiring a high degree of protection, for example OLEDs. Haskal et al., in U.S. Pat. No. 5,952,778, issued Sep. 14, 1999, and entitled "Encapsulated Organic Light Emitting Device", proposed an encapsulation scheme to prevent the oxidation and degradation of OLED devices due to exposure to oxygen, water, and other contaminants. The protective covering comprises three contiguous layers, which include 1) a first layer of thin passivation metal; 2) a second layer of thin film deposited dielectric material such as silicon dioxide or silicon nitride; and, 3) a third layer of a hydrophobic polymer.

Park et al., in U.S. Pat. No. 6,926,572, issued Aug. 9, 2005, entitled "Flat Panel Display Device and Method of Forming Passivation Film in the Flat Panel Display Device" teach a low temperature protective barrier film which is a combination of multiple organic and inorganic films. Simultaneous vapor deposition of silicon tetrachloride and dimethyldichlorosilane onto a glass substrate is said to result in a hydrophobic coating comprised of cross-linked polydimethylsiloxane which may then be capped with a fluoroalkylsilane (to provide hydrophobicity). The substrate is said to be glass or a silicon oxide anchor layer deposited on a surface prior to deposition of the cross-linked polydimethylsiloxane. The substrates are cleaned thoroughly and rinsed prior to being placed in the reaction chamber.

Some methods useful in applying layers and coatings to substrates have been briefly described above. There are numerous other patents and publications which relate to the deposition of functional coatings on substrates, but which appear to be more distantly related to the present invention. To provide a monolayer or a few layers of a continuous functional coating on a substrate surface so that the surface will exhibit particular functional properties it is necessary to tailor the coating precisely. Without precise control of the deposition process, the coating may lack thickness uniformity and surface coverage. The presence of non-uniformities may result in functional discontinuities and defects on the coated substrate surface which are unacceptable for the intended application of the coated substrate.

U.S. patent application Ser. No. 10/759,857 of the present applicants describes one kind of processing apparatus which can provide specifically controlled, accurate delivery of precise quantities of reactants to a processing chamber, as a means of improving control over a CVD coating deposition process. The subject matter of the '857 application is hereby incorporated by reference in its entirety.

SUMMARY

The present invention is related to a chemical vapor deposition method of coating and treating materials to provide super-hydrophilic surface properties, or super-hydrophobic surface properties, or combinations of such properties at various locations on a given surface.

The invention also relates to electronic applications which make use of the super-hydrophobic surface properties to protect objects, such as electronic boards and components of electronic devices. In particular, the boards and components are protected from damage due to accidental and environmental factors, especially due to wetting, spills, and water condensation.

One skilled in the art of biological applications or optical applications can envision a large number of instances which may make use of super-hydrophilic surface properties, or which may make use of a surface which comprises both areas which are super-hydrophilic and areas which are super-hydrophobic.

One aspect of the present invention pertains to a chemical vapor deposition method of treating and coating materials to provide the desired super-hydrophobic or super-hydrophilic properties. A surface topography is created using a CVD deposition of particles nucleated in situ by reacting two or more vaporous precursors in the gas phase to form nano-particles. The nano-particles are subsequently deposited onto the substrate, forming a rough surface topography. The gas phase reaction processing parameters are controlled so that the size of the resulting surface topography is carefully controlled. As a method of monitoring the effect of various processing parameters on the resulting surface topography, a surface roughness in nanometers RMS (Random Mean Square) is measured by AFM (Atomic Force Microscopy). By varying the process parameters, it was possible to control the RMS from a few up to hundreds of nanometers. The processing parameters which were controlled included the amount of reactants charged to the processing chamber, the relative ratios of reactants, the reaction pressure, time, and temperature, and the number of reaction cycles, by way of example and not by way of limitation.

In a typical embodiment rough metal oxide films were produced by nucleating metal oxide nano-particles in a gas phase and depositing them onto the substrate. In the past, such spontaneous gas phase reactions have been purposely avoided because they were considered to produce undesirable particles due to gas phase nucleation. In the present instance, a method of controlling process variables has been developed and the gas reaction which was previously considered to be a problem has been purposely used to form nano-particles. The reaction parameters are selected to control the rate of nano-particle formation and consequently to obtain the desired size of the features, which is illustrated by the surface roughness measurement. Examples of the reaction parameters and their impact on surface roughness are described in the detailed description. RMS values ranging from about 8.5 nm to 124 nm have been obtained. FIG. 1 shows the 8.53 nm RMS surface topography of a single crystal silicon substrate covered with nano-particles deposited from a reactive vapor phase. FIG. 2 shows the 13.3 nm RMS surface topography of the same substrate covered with nano-particles deposited from a reactive vapor phase. FIG. 3 shows the 88.83 nm RMS surface topography of the same single crystal silicon substrate covered with nano-particles deposited from a reactive vapor phase. FIG. 4 shows the 124 nm RMS surface topography of the same substrate covered with nano-particles deposited from a reactive vapor phase. The differences in surface topography shown in FIGS. 1-4 were obtained by variation of the processing parameters described above.

Organometallics, metal chlorides, highly reactive chlorosilanes and other vaporous precursors can be used in vapor phase reactions to produce similarly rough surface topography. Control of the partial pressures of the reactants in the processing chamber, the reaction pressure, temperature and time, and the number of nucleation/deposition cycles enables the formation of sized nano-particles and surface roughness features. In the case of insufficient gas phase reaction, the resulting surface roughness is too small (RMS is less than about 5 nm), and the contact angle is degraded to an angle far below the 150 degrees which is considered to be a super-hydrophobic surface. In the case where there is too much gas phase reaction, the resulting surface roughness becomes too large (RMS is greater than about 100 nm), with the layer of deposited material being very fluffy and not well adhered to the substrate. The average thickness of the layer of deposited nano-particles typically ranges from about 100 Å to about 1,000 Å. This thickness of the layer may be controlled by the number of sequential nano-particle deposition cycles. A layer deposited using organometallic, metal chloride, and/or a highly reactive chlorosilane precursor forms a super-hydrophilic surface layer.

To produce a super-hydrophobic surface which is maintained over time after exposure to environmental conditions, the surface of the deposited nanoparticles is typically coated (functionalized) with a self assembling monolayer of a fluorine-containing polymer.

An alternative to the use of a fluorocarbon coating over the surface of the deposited nano-particle layer is to include, in-situ in the gas phase mixture, an alkylsilane, alkylaminosilane, perfluoroalkylsilane or similar precursor, as a part of the reactive precursor materials used to form the nano-particles. For example, an organometallic, metal chloride, or highly reactive chlorosilane reactive precursor may be used as a reaction precursor in combination with an alkylsilane, alkylaminosilane, or perfluoroalkylsilane.

When the surface of a substrate to which the super-hydrophobic coating is applied is one which is difficult to adhere to, such as various polymeric materials and noble metals, by way of example and not by way of limitation, conventional spin-on, PVD, CVD, or ALD metal oxides and silicon oxides, as well as the corresponding nitrides may be deposited as adhesion layers prior to deposition of the super-hydrophobic surface layer.

A super-hydrophobic surface can subsequently be applied over the surface of the adhesion layer. The super-hydrophobic surface can be tailored to a desired degree of hydrophobicity or can be patterned to exhibit super-hydrophobic properties in some areas and superhydrophilic properties in other areas by selectively removing the hydrophobic coating from an underlying hydrophilic substrate surface. Masking or patterning using lithographic techniques can be used in combination with oxygen etching or UV radiation exposure to selectively remove the hydrophobic coating from particular areas on a substrate surface.

In another embodiment, a coating of a hydrophilic functional polymeric layer such as bis-trichlorosilyl-ethane or methoxy(polyethylene glycol) MPEG, for example, may be deposited over a nano-particle deposited super-hydrophilic surface layer to stabilize the surface and maintain the super-hydrophilic surface property.

There are many applications for super-hydrophobic surface layers. One embodiment is in the area of protective films over the surfaces of electronic devices, such as digital cameras, cell phones, digital music and video players, portable computers, marine electronics and other devices which require continuous operation in adverse environmental conditions, and resistance to occasional exposure to water or other liquids. A typical protective film includes a first layer of a moisture barrier material, which may be a single or multi-layer of a metal oxide or nitride, for example, and not by way of limitation. A super-hydrophobic film of the kind described above is deposited over the surface of the moisture barrier material. As previously discussed, the metal oxide or nitride may be formed from reactive precursor materials which are also used in combination with other precursor materials to form the super-hydrophobic layer.

There are many applications for super-hydrophilic surface layers. Some of the most valuable applications are for use in biological applications, microfluidic devices and optical application (anti-fog coatings for lenses and mirrors, for example).

BRIEF DESCRIPTION OF THE DRAWINGS

FIG. 7 also shows the same model of cell phone board 704 which was protected with a super-hydrophobic film of the kind described herein and exposed to water for a time period of about 10 minutes at atmospheric pressure and ambient temperature conditions. No wetting of the board was observed after the exposure.

DETAILED DESCRIPTION OF THE PREFERRED EMBODIMENTS

Figure 1:
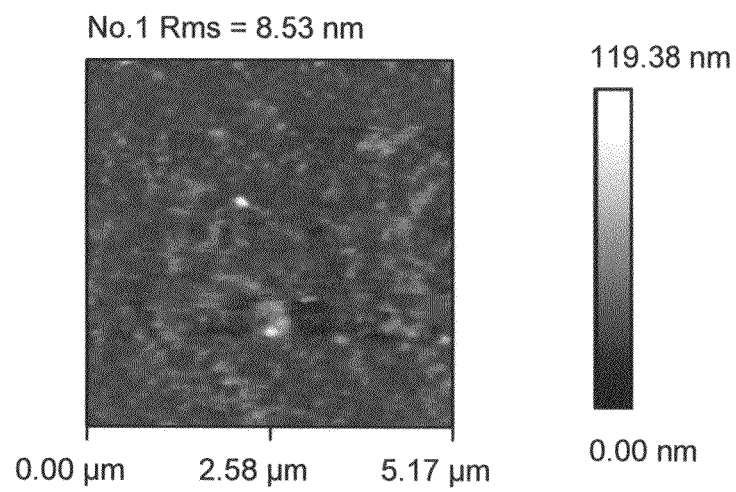
FIG. 1 shows an AFM image of an 8.53 nm RMS surface topography obtained on a single crystal silicon substrate, by deposition of a layer of nano-particles from a reactive vapor phase comprising trimethyl aluminum (TMA) and water vapor.

One aspect of the present invention relates to a chemical vapor deposition method of coating and treating materials to provide super-hydrophilic and/or super-hydrophobic surface properties. In a method embodiment of the invention, a rough surface is created using the CVD deposition of particles formed in situ in the gas phase above a substrate. The method includes: Reacting two or more vaporous precursors in the gas phase under vacuum at sub-atmospheric pressures to form nano-particles. The nano-particles are subsequently deposited on the substrate, forming a rough surface texture. The gas phase reaction parameters are controlled so that the size of the nano-particles formed in the gas phase is on the order of tens-to-hundreds of nanometers. Typically the processing parameters which are controlled include the amount of reactants, the relative amount of reactants, reaction pressure, time, and temperature during the CVD reaction. A number of CVD deposition cycles may be used, with the number of cycles affecting the size of the nano-particles. The topography which results on the surface of a substrate on which the nano-particles have been deposited can be detected using AFM (Atomic Force Microscopy) by way of example, and not by way of limitation. This measurement technique provides an image of the surface and permits calculation of various feature sizes, including a surface roughness in nm RMS (Random Mean Square) which permits an overall comparison of various surface roughness from sample to sample evaluated.

A super-hydrophilic surface typically exhibits a contact angle of 0 degrees, and is obtained when the nano-particles formed in the CVD reaction are hydrophilic particles. A super-hydrophilic surface can subsequently be made super-hydrophobic by deposition of a hydrophobic self-aligned monolayer (SAM), which may be applied by vapor deposition or any other conventional deposition method including deposition from liquid. Alternatively, a super-hydrophobic surface may be obtained when the nano-particles formed in the CVD reaction are hydrophobic particles.

As previously described, a super-hydrophobic surface typically exhibits a contact angle which is greater than about 150 degrees. A super-hydrophobic surface obtained by one of the above reactions can subsequently be tailored to a desired degree of hydrophobicity or may be converted to completely exhibit super-hydrophilic properties in desired areas by removing the hydrophobic film from the substrate surface by means of etching or radiation exposure. Masking or patterning by using lithographic techniques can be used to create patterns and gradients of super-hydrophobic and super-hydrophilic areas.

A rough super-hydrophilic surface which has been patterned as described above can be subsequently functionalized to provide a desired surface reactivity for a particular chemistry using standard silanization methods in either vapor or liquid phase.

Examples of Chemical Vapor Deposition of
Super-Hydrophobic or Super Hydrophilic Surfaces Example One During current experimentation, we formed rough alumina films in a single step by nucleating alumina nano-particles in a gas phase and depositing them onto a single crystal silicon substrate. In one implementation a CVD reaction of TMA (trimethylaluminum) and water vapor was used. In the past, such spontaneous gas phase reactions were considered to be problematic since they produced undesirable particles due to gas phase nucleation. In the present instance, such a gas phase reaction has been purposely used to form nano-particles. The reaction parameters are selected to control the rate of nano-particle formation and consequently the desired size of the surface roughness features. Examples of the reaction parameters and their impact on surface roughness are shown in the Table One below, where reaction precursors of TMA and Water Vapor were used to produce roughened surfaces. In one instance, a combination of TMA, Water Vapor and perfluorodecyltrichlorosilane (FDTS) reaction precursors were used to produce a particularly rough surface.

The chemical vapor deposition reactions described below were carried out using an MVD-100 processing system which is commercially available from Applied Microstructures, Inc. of San Jose, Calif.

TABLE ONE

| Run No. | FDTS Partial Pressure (Torr)* | TMA Partial Pressure (Torr)* | $H_2O$ Vapor Partial Pressure (Torr)* | Time (min) | Temp (° C.) | Layer Thickness Å | RMS (nm) |
|---|---|---|---|---|---|---|---|
| 1 | — | 6 | 40 | 10 | 60 | — | 8.5 |
| 2 | — | 7 | 40 | 10 | 60 | — | 13.3 |
| 3 | — | 4 | 30 | 0.5 | 60 | — | 88.8 |
| 4 | 4 × 0.5** | 1 | 40 | 1 | 60 | — | 123.6 |

*The reactant was measured by placement in a known volume at the pressure indicated and that amount of material was charged to the CVD chamber. Therefore, the relative amounts of each of the reactants is indicated by its partial pressure in Torr.
**The FDTS exhibits a lower vapor pressure, and four volumes of material, each volume at 0.5 Torr were charged to the CVD chamber over a time period of about 10 seconds. The reaction time periods referred to above indicate the reaction time after all of the reactants have been injected.

While perfluorodecyltrichlorosilane (FDTS) is used in the example above, there are a number of other silanes which may be used. Other example materials include, but are not limited to fluoro-tetrahydrooctyldimethylchlorosilane (FOTS), undecenyltrichlorosilanes (UTS), vinyl-trichlorosilanes (VTS), decyltrichlorosilanes (DTS), octadecyltrichlorosilanes (OTS), dimethyldichlorosilanes (DDMS), dodecenyltricholrosilanes (DDTS), perfluorooctyldimethylchlorosilanes, aminopropylmethoxysilanes (APTMS), fluoropropylmethyldichlorosilanes, and perfluorodecyldimethylchlorosilanes. The OTS, DTS, UTS, VTS, DDTS, FOTS, and FDTS are all trichlorosilane precursors. The other end of the precursor chain is a saturated hydrocarbon with respect to OTS, DTS, and UTS; contains a vinyl functional group, with respect to VTS and DDTS; and contains fluorine atoms with respect to FDTS (which also has fluorine atoms along the majority of the chain length). One skilled in the art of organic chemistry can see that the vapor deposited coatings from these precursors can be tailored to provide particular functional characteristics for a coated surface. The use of precursors which provide a fluorocarbon or a hydrocarbon surface provide excellent hydrophobic properties.

As previously mentioned, adding an organo-silane fluorocarbon reactant to the process in which the nano-particles are formed may be used as a method of obtaining a surface which exhibits hydrophobic or functional properties. In the alternative, an organo-silane may be used for formation of a thin film over the surface of the deposited nano-particles. Organosilane precursor materials may include functional groups such that the silane precursor includes an alkyl group, an alkoxyl group, an alkyl substituted group containing fluorine, an alkoxyl substituted group containing fluorine, a vinyl group, an ethynyl group, or a substituted group containing a silicon atom or an oxygen atom, by way of example and not by way of limitation. In particular, organic-containing precursor materials such as (and not by way of limitation) silanes, chlorosilanes, fluorosilanes, methoxy silanes, alkyl silanes, amino silanes, epoxy silanes, glycoxy silanes, and acrylosilanes are useful in general.

FIG. 1 shows an AFM image of the 8.53 nm RMS surface topography obtained on a single crystal silicon substrate by deposition of a layer of nano-particles from a reactive vapor phase comprising trimethyl aluminum (TMA) and water vapor using the processing conditions specified under Run No. 1 in the Table One above.

Figure 2:
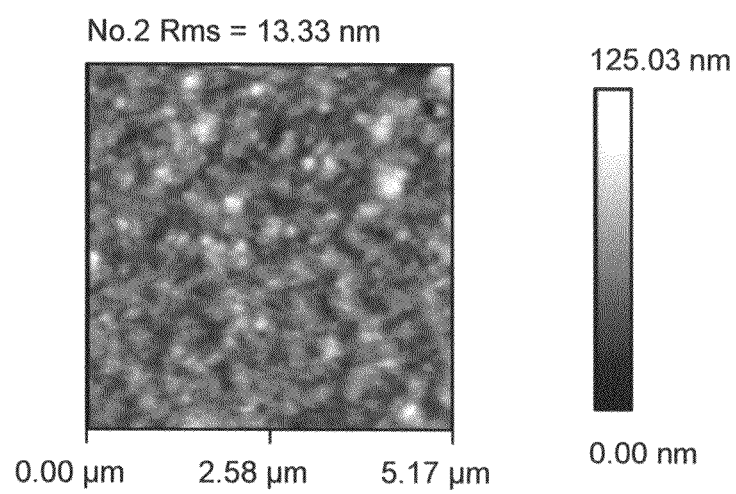
FIG. 2 shows an AFM image of a 13.3 nm RMS surface topography obtained on the same single crystal silicon substrate by deposition of a layer of nano-particles from a reactive vapor phase comprising TMA and water vapor, where the amount of TMA was increased by about 17% over the amount which was present during the formation of the nano-particles layer shown in FIG. 1.

FIG. 2 shows an AFM image of a 13.3 nm RMS surface topography obtained on the same single crystal silicon substrate by deposition of a layer of nano-particles from a reactive vapor phase comprising TMA and water vapor using the processing conditions specified under Run No. 2 in Table One above.

Figure 3:
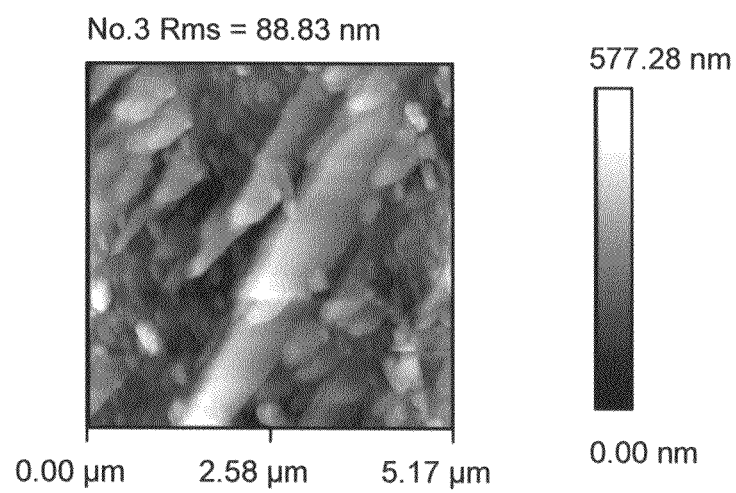
FIG. 3 shows an AFM image of an 88.83 nm RMS surface topography obtained on the same single crystal silicon substrate by deposition of a layer of nano-particles from a reactive vapor phase comprising TMA and water vapor. Rather than one deposition cycle, 15 deposition cycles were used, where the amount of TMA and water vapor present were decreased and the reaction time was decreased from that used to produce the nano-particles layer shown in FIG. 1.

FIG. 3 shows an AFM image of an 88.83 nm RMS surface topography obtained on the same single crystal silicon substrate by deposition of a layer of nano-particles from a reactive vapor phase comprising TMA and water vapor using the processing conditions specified under Run No. 3 in Table One above.

Figure 4:
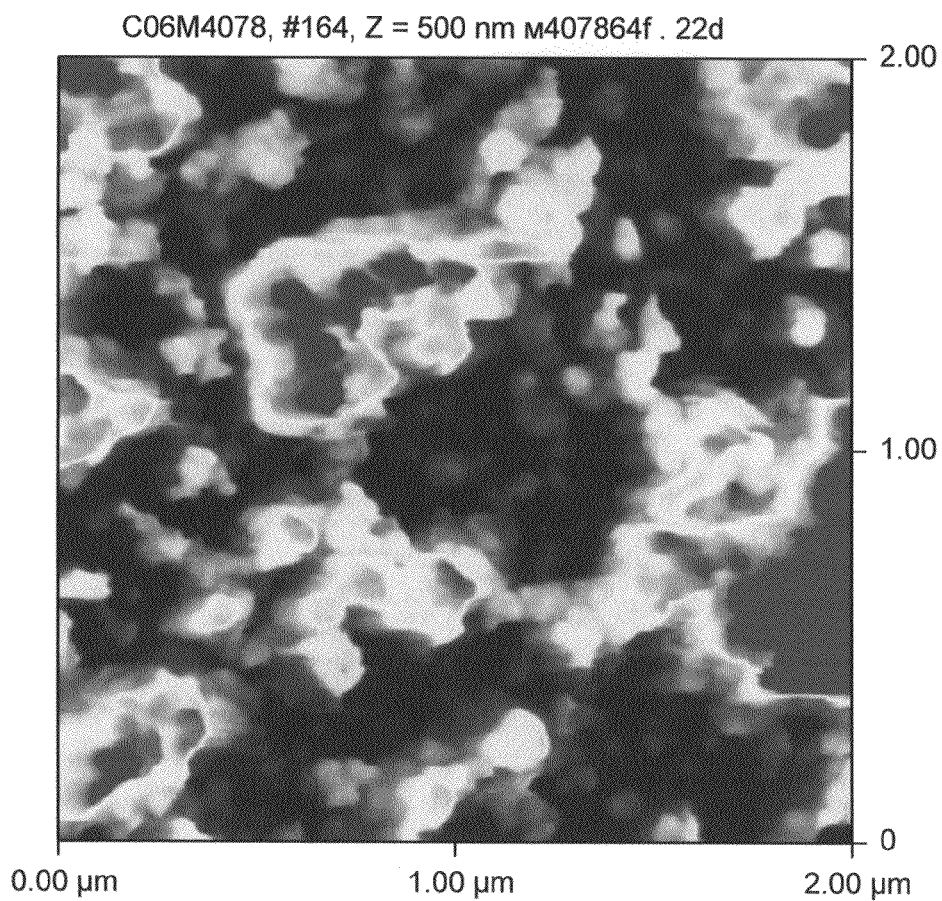
FIG. 4 shows an AFM image of a 124 nm RMS surface topography obtained on the same single crystal silicon substrate by deposition of a layer of nano-particles from a reactive vapor phase comprising TMA, water vapor, and perfluorodecyltrichlorosilane (FDTS).
Figure 5A:
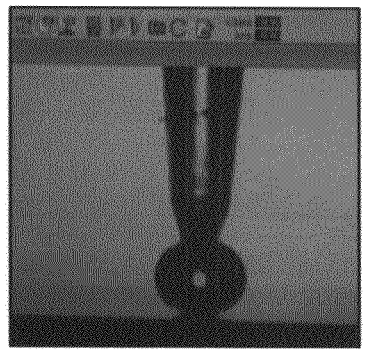
FIGS. 5A-5D show a series of photos of a water droplet being dragged along a super-hydrophobic surface of the kind created using the method of the present invention. Since the surface cannot be made wet, it is almost impossible to deposit the droplet onto such a surface. The droplet is repelled so strongly that it bounces off.
Figure 5B:
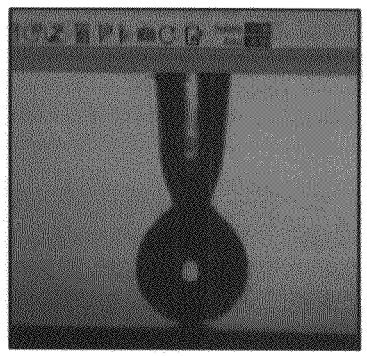
Figure 5C:
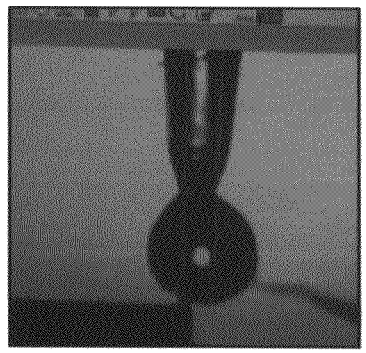
Figure 5D:
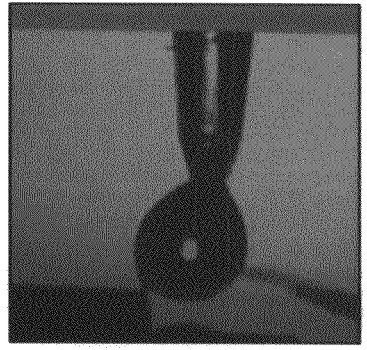

FIG. 4 shows an AFM image of a 124 nm RMS surface topography obtained on the same single crystal silicon substrate by co-deposition of a layer of nano-particles from a reactive vapor phase comprising TMA, water vapor, and (FDTS) using the processing conditions specified under Run No. 4 in Table One above.

As can be seen, large variation of surface roughness can be achieved as a function of the processing conditions. In the case of insufficient gas phase reaction the resulting surface roughness is too small (RMS<5 nm) and the contact angle is degraded. Uncontrollable gas phase reactions result in formation of boulders and agglomerates with surface features that are too large (RMS>100) and typically unstable.

When the partial pressure of TMA was 1 Torr, the partial pressure of water vapor was 40 Torr, and the partial pressure of FDTS was 2.0 Torr, as shown in Table One, this set of conditions produced a topographic layer where the surface roughness was about 124 nm RMS, and the layer was fluffy and did not provide good adhesion to the substrate. The roughness of the resulting super-hydrophobic coating is shown in FIG. 4. The AFM roughness image of the super-hydrophobic layer indicates a thickness of 150 Å; RMS greater than 123 nm; grey areas with light borders indicate peaks (the largest size features on the surface); dark image color indicates valleys. Larger features appear to be made out of smaller size particles (see shaded contours) which are visibly distributed across the surface.

By adjusting the partial pressure of these reactants to fall within the range specified below, in Example Two, better control over the topographic layer produced was obtained, and the surface roughness decreased to fall within a range of about 8 nm RMS to about 20 nm RMS. The topographic layer produced was not fluffy and exhibited improved adhesion based on a wiping test.

Example Two

As discussed above, a single step reaction can be used to form a super-hydrophobic film. A one-step CVD reaction may be carried out, which consists of introducing two highly reactive vapors (TMA and Water) and a fluorocarbon vapor (FDTS) into the reactor under controlled conditions to form hydrophobic nano-particles, and depositing the resulting nano-particles onto a substrate surface to form a super-hydrophobic topographic layer having a water contact angle >150 degrees. It was necessary to adjust the relative precursor partial pressures which were illustrated in Run No. 4 of Table One to obtain a topographic layer which showed lower porosity and better adhesion to the substrate. Recommended reaction precursors and process conditions are as follows: TMA, partial pressure 0.2-2 Torr; Water vapor, partial pressure 2-20 Torr; FDTS, partial pressure, 0.02-0.5 Torr; Reaction temperature, room temperature to 100° C., typically 40-70° C.; Reaction time 5-30 min. This reaction can be repeated for a number of cycles depending on requirement of thickness of the topographic layer produced and the roughness characteristics of the substrate surface created. Typically a surface roughness in the range of about 10 nm RMS to about 80 nm RMS is indicative of an acceptable hydrophobic topographic layer.

Precursors other than TMA and water, e.g. metal chlorides or highly reactive chlorosilanes, can be used alternatively to produce similarly rough surface topography.

In case of substrate materials which are difficult to adhere to (polymers, plastics, certain metals, etc.), conventional metal oxides, silicon oxides, nitride films or organic layers can be deposited as adhesion layers prior to roughening of the surface to become super-hydrophilic or super-hydrophobic. As an example, we have used a low temperature atomic layer deposition (ALD) reaction using TMA and water vapor to form the adhesion layer. Such a reaction is well known in the literature and consists of alternating exposure of the substrate to TMA (step A) and water (step B) in a number of repetitive AB cycles, a method conceptually different than the reaction described above for the creation of nano-particles. The use of the same reactants for both adhesion layer as well as the rough top layer is, however, very beneficial as it allows the use of a single CVD/ALD reactor for film deposition.

Example Three

A two step reaction may be used to produce a super-hydrophobic film. In this example, a two step CVD reaction was carried out, comprising:

Step 1) Introducing two highly reactive vapors (TMA and Water) into the reactor under controlled conditions (below) to form hydrophilic nano-particles and depositing the resulting nano-particles onto a substrate surface, followed by Step 2) Functionalizing the resulting rough surface with a hydrophobic coating by vapor deposition of a SAM (FDTS, perfluorodecyltrichlorosilane, precursor was used, for example and not by way of limitation).

Preferred reaction precursors and CVD process conditions for the two step reaction: Step 1): TMA, partial pressure 2-10 Torr; Water, partial pressure 20-60 Torr; Reaction temperature, room temperature to 100° C., typically 40-70° C.; Reaction time 5-30 minutes. Step 2): FDTS, partial pressure 1-2 Torr; Water, partial pressure 5-10 Torr; Reaction temperature, room temperature to 100° C.; typically 40-70° C.; Reaction time 5-15 minutes.

The first step can be repeated a number of cycle times depending on the requirement of thickness of the topography layer produced and the roughness characteristics of the substrate surface created.

The results after each step were monitored and determined to be as follows. A Super-hydrophilic surface was obtained after Step 1, where the water contact angle was 0 degrees, and there was complete wetting, so no sliding angle is measurable. A Super-hydrophobic surface was obtained after Step 2, where the water contact angle was >150 degrees, and the sliding angle was <5 deg.

A typical super-hydrophobic surface obtained using the two step process exhibits a surface roughness ranging between about 8 nm RMS and about 20 nm RMS, similar to the surface roughness obtained using the single step process described in Example Two. The adhesion to the underlying single crystal silicon substrate was also similar to that obtained using the single step process described in Example Two.

The wetting behavior and repelling of water which occurs on a super-hydrophobic surface of the kind described herein is illustrated in FIGS. 5A-5D. FIGS. 5A-5D are a series of photographs which show a water droplet being dragged along the super-hydrophobic surface. Since the surface cannot be made wet, it is almost impossible to deposit the droplet onto such a surface. The water tends to jump off the surface onto an area surrounding the sample.

Example Four

A super-hydrophobic film with an in-situ adhesion/barrier layer can be produced using one embodiment of the method. In the case of materials which exhibit poor adhesion (polymers, plastics, certain metals, etc.) conventional Spin-on, PVD, CVD, or ALD metal oxides, silicon oxides, as well as the corresponding nitride films can be deposited as adhesion layers prior to creation of a super-hydrophobic film. In the present example we have used the same reactants for both the adhesion layer as well as the super-hydrophilic top layer to allow the use of a single reactor and an in-situ deposition of the multilayer film. Specifically, an ALD reaction of TMA and water was used to form an ALD alumina adhesion/barrier layer. The reaction consists of alternating exposure of the substrate to reactants A and B in a number of repetitive AB cycles with a nitrogen gas purge and pump steps in between each A and B step, to remove the residual non-adsorbed, non-reacted chemicals—a method conceptually different than the reaction described above for the creation of nanoparticles.

Step 1) Deposition of an ALD adhesion/barrier layer: Sequentially injecting TMA and water vapor precursors into the reactor to form 20-300 Å thick layer of ALD alumina. Process conditions: Precursor A (TMA), partial pressure 0.2-2 Torr; Precursor B (Water), partial pressure 2-20 Torr; Reaction temperature 20-150° C. (typically 40-70° C.); Number of repetitions of step A followed by step B (a cycle): 30-100 with nitrogen purge/pump in-between injections of precursor A and precursor B.

Step 2) Deposition of super-hydrophobic layer by either of the methods described in Examples 2 and 3.

The super-hydrophobic surface properties were essentially the same as those described for Examples 2 and 3.

Example Five

A super-hydrophobic surface of the kind described above can subsequently be tailored to a desired degree of hydrophobicity or can be patterned to exhibit super-hydrophilic properties in selected areas by selectively removing the hydrophobic coating from the surface. Masking or patterning by using lithographic techniques can be used, combined with oxygen etching or U.V. Exposure.

A super-hydrophobic film surface was exposed through a shadow mask to 254 nm/185 nm UV radiation in air, sample distance from the UV source was 6 mm, allowing for a selective removal of the hydrophobic properties in areas illuminated by UV radiation. A similar result could be obtained by lithographic patterning and plasma etching of the film. As can be seen in Table Two, forming a pattern of super-hydrophobic and super-hydrophilic areas is feasible.

The contact angle was measured in various areas of a patterned structure, where portions of the structure were exposed to U.V. radiation.

TABLE TWO

| | EXPOSURE TIME 5 MINUTES |
|---|---|
| Contact angle in UV exposed area (line of sight) | <3 (Super-hydrophilic) (complete removal) |
| Contact angle under the shadow mask (not exposed to UV light) | >150 (Super-hydrophobic) (zero removal) |

Another aspect of the present invention relates to use of the super-hydrophobic and super hydrophilic surfaces in product applications. One of the major applications for the super-hydrophobic surfaces pertains to protecting objects such as boards and components of electronic devices from damage due to accidental and environmental factors, especially due to wetting, spills and water condensation. Another of the major applications for the super-hydrophilic surfaces is in the field of biotechnology, where diagnostic tools and bio-compatible implants, for example find a super-hydrophilic biocompatible surface to be advantageous.

Application embodiments related to the protection of electronic boards and components of electronic devices is illustrated below. Electronic devices of particular vulnerability include digital cameras, cell phones, digital music and video players, portable computers, marine electronics and other devices that require continuous operation in adverse weather conditions and resistance to occasional exposure to water or liquids. A protective coating typically includes a combination of a single or multi-layer inorganic moisture barrier films followed by deposition of a super-hydrophobic film using the present method. The inorganic films can be either metal oxide or metal nitride films grown using conventional ALD or PVD techniques. Specifically, alumina (Al2O3) and titania (Ti2O5) films and their multi-layer combinations are well suited for moisture and gas permeability protection. TMA and TiCl4 (titanium tetrachloride) precursors were used respectively for depositing alumina and/or titania films with water vapor in an ALD reaction. The top layer of super-hydrophobic film was grown using the methods referenced above.

Experimentation has been carried out by forming various protective film combinations on electronic boards of cell phones, i-Pods, and flash cards. Electronic device boards were removed from the respective electronics products and coated with a dual layer film. The first layer of ALD alumina was 100 Å thick. The second super-hydrophobic layer was grown in-situ using TMA, water, and FDTS. Coated, reassembled, and electrically powered boards were subjected to accelerated tests by immersion in a highly ionized water solution. Unprotected electronic boards or electronic devices immersed in such corrosive ionic solution typically fail in a catastrophic way within the first 1-2 seconds of immersion. Protected boards continued working for at least the 10 minute time period during which they were tested.

Example Six

Figure 6A:
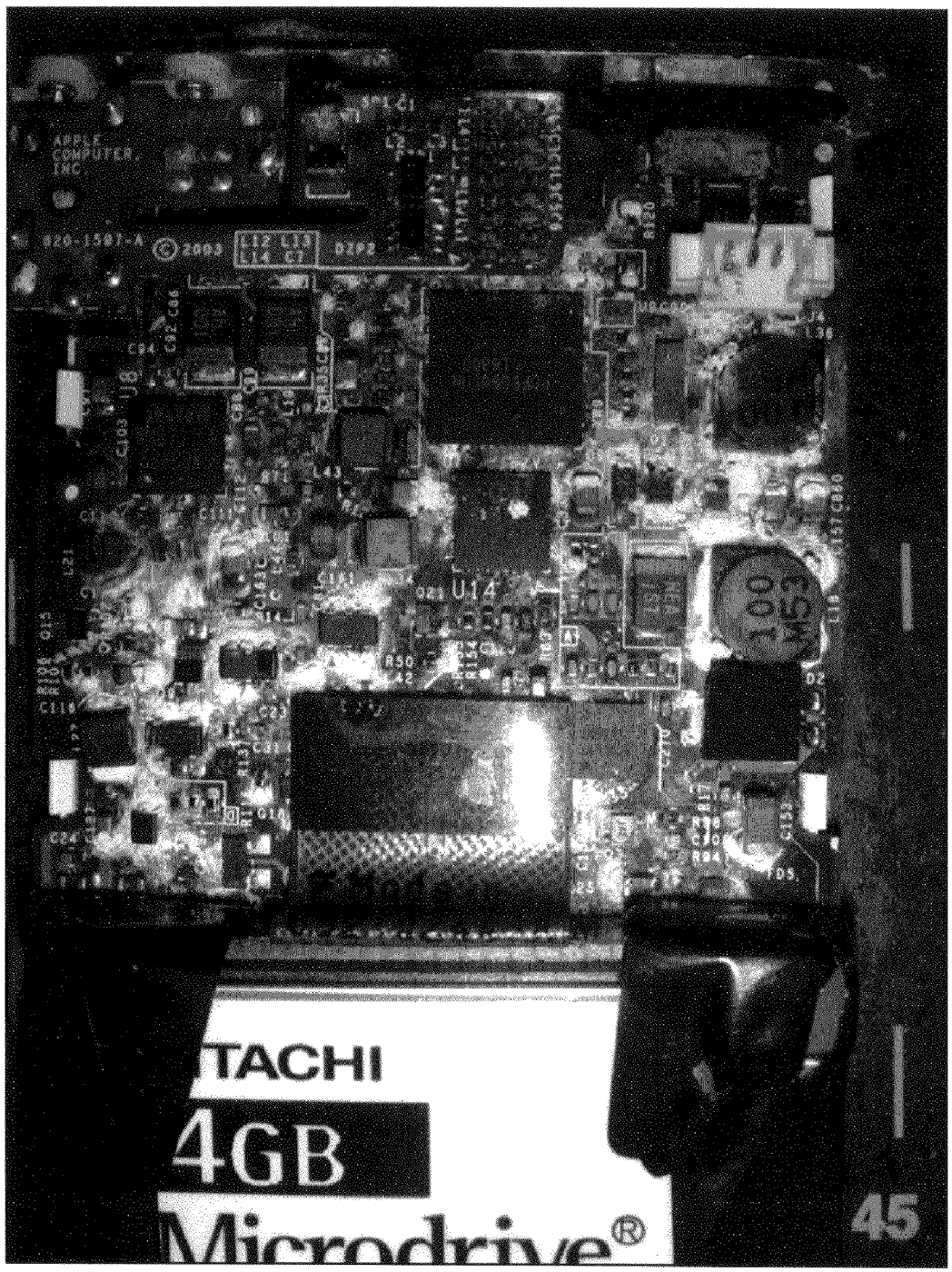
FIG. 6A shows the surface of a mini I-Pod® board after corrosion by an accidental Gatorade® spill over the surface of an I-Pod.
Figure 6B:
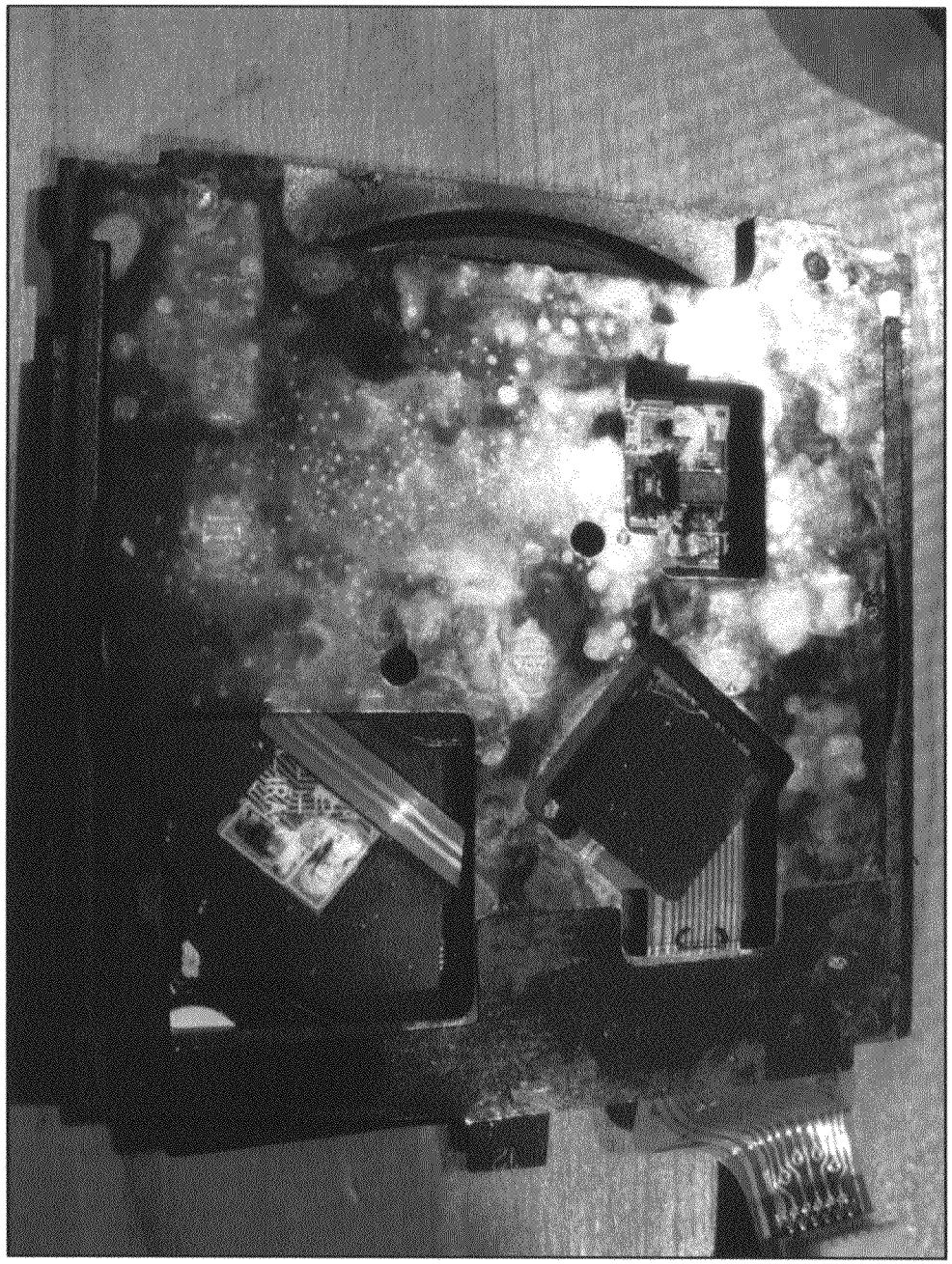
FIG. 6B shows the back of the control click wheel of the mini I-pod after the accidental Gatorade® spill referred to with respect to FIG. 6A.

An i-Pod Shuffle, Mini i-Pod board was found to corrode as a result of an accidental soft drink spill (FIGS. 6A and 6B). Subsequently, coated I-Pod Shuffle units were tested for protection against such spills. The I-Pod Shuffle was turned on (playing music) and then immersed in a highly concentrated Gatorade® solution of sodium and potassium ions. The unprotected I-Pod stopped operating within seconds. The I-Pod protected by the super-hydrophobic coating continued to operate for up to ten minutes while immersed in the test bath. The i-Pod was then rinsed with water, dried, and remains fully operational after several weeks. The FIGS. 6A and 6B photos show the damage to the main board, and to the back of the control click wheel, respectively. There is evidence of extreme corrosion and the unit is beyond repair. Application of the super-hydrophobic layer over the surface of the Mini i-Pod helps reduce the possibility of such damage, and enables salvaging of the electronic device in most instances.

Example Seven

Figure 7:
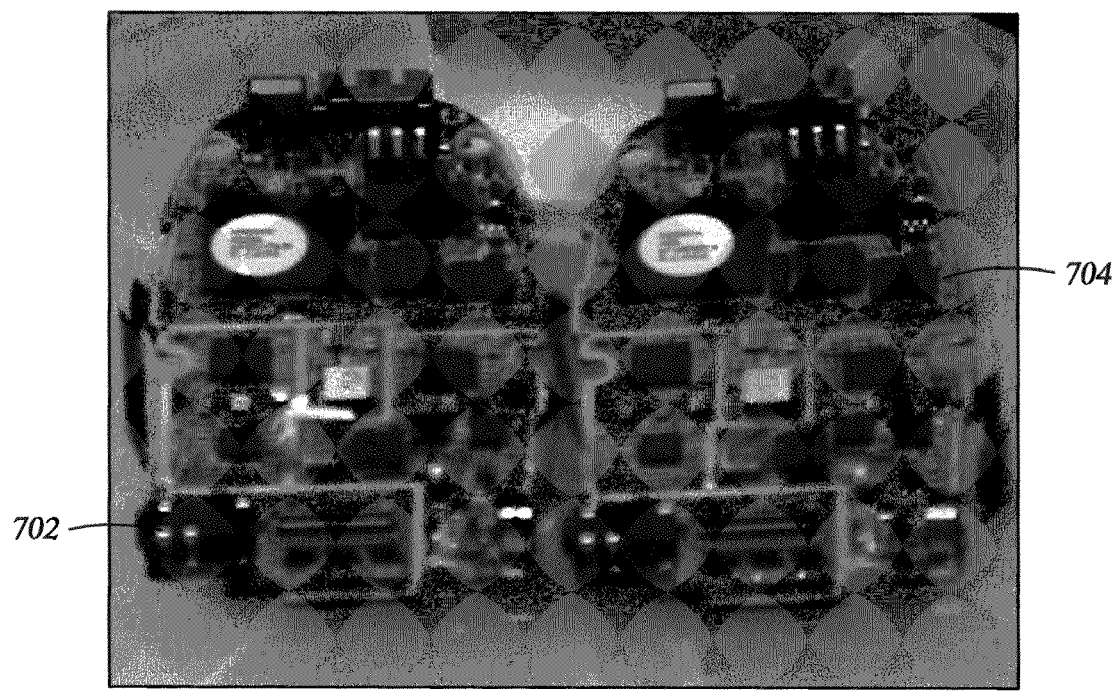
FIG. 7 shows a cell phone board 702 which was unprotected and exposed to water for a time period of about 10 minutes at atmospheric pressure and ambient temperature conditions. Wetting, which can lead to corrosion is evident in the central portion of the board.

Mobile phone board assemblies, illustrated in FIG. 7, were removed from the phone plastic housing and coated with an alumina/super-hydrophobic coating. The entire boards were then immersed in tap water for a time period of about 10 minutes, and were shown to be protected from water, which would immediately spill off. Re-assembled phones tested for functionality were found to be fully operational and resistant to wetting.

A cell phone board 702 illustrated in FIG. 7, which was uncoated, wets well and accumulates moisture. A cell phone board 704, which was coated with the alumina/super-hydrophobic dual layer previously described, does not wet and resists moisture accumulation. Both boards look similar, as the protective coating is transparent to visible light; however, the coated board does not wet. Digital cameras and other electronics protected by such a metal oxide (or metal nitride)/super-hydrophobic dual layer will be protected in a manner similar to that described with respect to the mobile phone board assemblies. Protective coatings described above can be used in many other electronics products including but not limited to computer boards, keyboards, electronic games, and GPS devices can be protected. An entire board of a Blackberry device coated with a protective anti-wetting film was soaked in red ink solution for a time period of about 10 minutes, and then rinsed in water and dried. The Blackberry device was then re-assembled and has since been in continuous use. Although tests using digital cameras were not performed in this study the inventors contend there is a high degree of certainty that the alumina/super-hydrophobic coating would have a similar protective effect when used to protect digital cameras.

Example Eight

Figure 8:
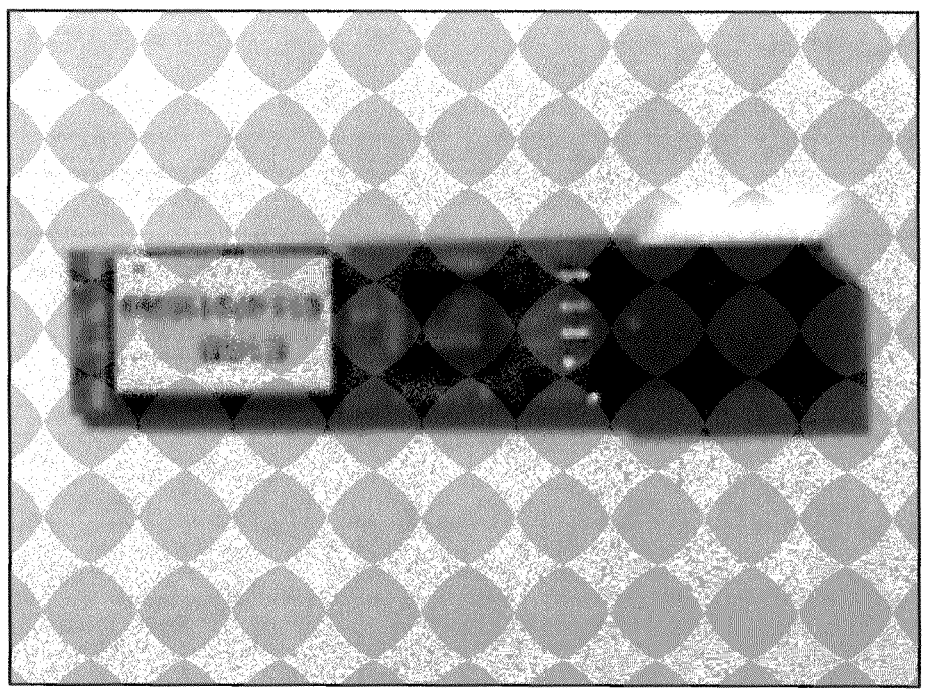
FIG. 8 shows a flash memory board of the kind which was tested for protection from liquids by a super-hydrophobic film of the kind described herein.

A Flash Memory Stick of the kind shown in FIG. 8 was connected to the computer via USB port and immersed in the test bath. Access to the files stored in the flash memory was tested as a function of time. An unprotected flash memory board stopped operating in an ionic liquid immersion test within the first two seconds. A protected flash memory board coated with a thin (100 Å) layer of ALD alumina film exhibited similar failure of operation within 2 seconds of immersion. However, with the ALD alumina film present, the operation could be recovered by rinsing the board with water and drying. To our surprise, a similar result was obtained in the case of a dual layer protective coating, where the dual layer consisting of an ALD alumina underlayer, with a CVD layer of a SAM fluorocarbon film. Immediate failure occurs despite the fact that the SAM fluorocarbon film provides an additional anti-wetting protection. The alumina/super-hydrophobic dual layer coating was found to provide the highest degree of protection. This dual layer coating enables continuous operation of the memory board immersed in the test bath for over 10 minutes. This is due to the ability of the super-hydrophobic film to protect the underlying alumina from the test liquid. Moreover, the board can easily be rinsed in water and dried after the test without any damage to its operation. The re-assembled device remains fully functional after several weeks of operation.

Example Nine

A single crystal silicon wafer was coated with a super-hydrophobic layer in the manner described in Example Three. The surface of the coated wafer was then exposed to patterned U.V. radiation through a mask using a UV-Ozone system of the kind available from UVOCS Corporation of Montgomeryville, Pa. The pattern was one of microfluidic channels of the kind which are used for diagnostics in the medical industry. The super-hydrophobic layer was removed (stripped away) from areas which were exposed to UV in the presence of Ozone. The resultant device was an array of microfluidic channels, which were created without the need to etch a substrate surface.

The above described exemplary embodiments are not intended to limit the scope of the present invention, as one skilled in the art can, in view of the present disclosure expand such embodiments to correspond with the subject matter of the invention claimed below.

We claim:

1. A chemical vapor deposition method of forming a layer upon a surface of a substrate, which layer provides a topography over said substrate surface which can be tailored to provide a super-hydrophobic property or a super-hydrophilic property, wherein the topography which enables the super-hydrophobic or super-hydrophilic property is created by controlling chemical vapor deposition process parameters, including the chemical composition of the reactants, the relative amounts of the reactants, the process pressure, the process temperature, and the reaction time, such that nano-particles are produced in a vapor phase over the substrate surface and are deposited on said substrate surface in a controlled manner, to produce a surface topography which exhibits said super-hydrophobic or said super-hydrophilic property.

2. A chemical vapor deposition method in accordance with claim 1, wherein an RMS surface roughness ranging between about 8 nm RMS to about 100 nm RMS is obtained.

3. A method in accordance with claim 1, in which said chemical reactants used to form a topographic layer over said substrate surface comprise water vapor and at least one additional chemical reactant selected from the group consisting of an organometallic compound, a metal chloride, a silane compound and combinations thereof.

4. A method in accordance with claim 3, in which wherein said chemical reactants used to form a topographic layer over said substrate surface comprise an organometallic compound.

5. A method in accordance with claim 4, wherein the metal present in said organometallic compound is selected from the group consisting of aluminum, titanium, and combinations thereof.

6. A method in accordance with claim 5, wherein said organometallic compound is trimethyl aluminum.

7. A method in accordance with claim 3, wherein said at least one chemical reactant is a metal chloride or a silicon chloride selected from the group consisting of aluminum trichloride, titanium tetrachloride, silicon tetrachloride and combinations thereof.

8. A method in accordance with claim 3, wherein said at least one chemical reactant is a silane compound selected from the group consisting of a chlorosilane, an amino silane, and combinations thereof.

9. A method in accordance with claim 8, wherein said at least one chemical reactant is a reactive chlorosilane selected from the group consisting of perfluorodecyltrichlorosilane (FDTS), fluoro-tetrahydrooctyldimethylchlorosilane (FOTS), undecenyltrichlorosilanes (UTS), vinyl-trichlorosilanes (VTS), decyltrichlorosilanes (DTS), octadecyltrichlorosilanes (OTS), dimethyldichlorosilanes (DDMS), dodecenyltricholrosilanes (DDTS), perfluorooctyldimethylchlorosilanes, aminopropylmethoxysilanes (APTMS), fluoropropylmethyldichlorosilanes, and perfluorodecyldimethylchlorosilanes and combinations thereof.

10. A method in accordance with claim 3, wherein a hydrophobic chemical reactant is added to said chemical reactants at a time said nano-particles are formed.

11. A method in accordance with claim 1, wherein a surface with a super-hydrophobic property is formed, and wherein said super-hydrophobic surface is partially converted to a super-hydrophilic surface, in the form of a pattern by means of selective exposure to UV-oxygen or plasma etching of said super-hydrophobic surface.

12. A method in accordance with claim 1 or claim 3, wherein a plurality of chemical vapor depositions are made in sequence to provide a layer having a desired nominal thickness and surface roughness.

13. A method in accordance with claim 1, wherein, subsequent to formation of said super-hydrophobic surface, a functionalizing layer is deposited over said super-hydrophobic surface which creates a super-hydrophilic surface.

* * * * *